US 6,749,798 B2

(12) United States Patent
Kim et al.

(10) Patent No.: US 6,749,798 B2
(45) Date of Patent: Jun. 15, 2004

(54) HIGH DENSITY CERAMIC THICK FILM FABRICATION METHOD BY SCREEN PRINTING

(75) Inventors: Tae-Song Kim, Seoul (KR); Yong-Bum Kim, Seoul (KR); Hyung-Jin Jung, Seoul (KR)

(73) Assignees: Korea Institute of Science and Technology (KR); Kyung Ferrite Ind. Co., Ltd. (KR)

(*) Notice: Subject to any disclaimer, the term of this patent is extended or adjusted under 35 U.S.C. 154(b) by 0 days.

(21) Appl. No.: 10/030,531
(22) PCT Filed: Mar. 16, 2001
(86) PCT No.: PCT/KR01/00422
§ 371 (c)(1),
(2), (4) Date: Apr. 4, 2002
(87) PCT Pub. No.: WO01/88222
PCT Pub. Date: Nov. 22, 2001

(65) Prior Publication Data
US 2002/0171182 A1 Nov. 21, 2002

(30) Foreign Application Priority Data
May 13, 2000 (KR) ......................................... 2000-25622

(51) Int. Cl.$^7$ ................................................ B28B 1/00
(52) U.S. Cl. ...................................... 264/621; 264/643
(58) Field of Search ................................. 264/643, 621

(56) References Cited
U.S. PATENT DOCUMENTS

| | | | | |
|---|---|---|---|---|
| 4,409,261 A | | 10/1983 | Kuo .............................. 427/96 |
| 5,137,634 A | * | 8/1992 | Butler et al. ................. 210/490 |
| 5,457,598 A | * | 10/1995 | Radford et al. ........... 361/321.2 |
| 5,756,207 A | * | 5/1998 | Clough et al. .............. 428/375 |
| 5,997,795 A | * | 12/1999 | Danforth et al. ............ 264/401 |

FOREIGN PATENT DOCUMENTS

| | | |
|---|---|---|
| JP | 04215414 | 8/1992 |
| JP | 07205537 | 8/1995 |
| JP | 08096624 | 4/1996 |

OTHER PUBLICATIONS

English translation of Abstract for Japanese Application No. 07–205537 dated Aug. 8, 1995.
English translation of Abstract for Japanese Application No. 08–096624 dated Apr. 12, 1996.
English translation of Abstract for Japanese Application No. 04–215414 dated Aug. 6, 1992.
Sensors and Actuators A, 70 (1998) 98–103.
Sensors and Actuators A, 71 (1998) 139–143.
J. of Appl. Phys., 77 (1995) 3349–3353.
J. of Appl. Phys., 81 (1997) 876–881.

* cited by examiner

Primary Examiner—Christopher A. Fiorilla
(74) Attorney, Agent, or Firm—Ostrolenk, Faber, Gerb & Soffen, LLP

(57) ABSTRACT

A high density ceramic thick film is fabricated by providing vehicle comprising an organic binder and solvent, dispersing ceramic powders into the vehicle to be paste, forming the paste to thick film by screen printing, removing the organic binder from the film, applying sol or sol-like solution to the surface of the film so that the sol or sol-like solution can infiltrate into the film, removing remaining sol or sol-like solution from the surface of the film, drying and preheating the film, and sintering the film.

7 Claims, 2 Drawing Sheets

HIGH DENSITY CERAMIC THICK FILM FABRICATION METHOD BY SCREEN PRINTING

This application is a 371 of PCT/KR01/00422 filed Mar. 16, 2001.

TECHNICAL FIELD

The present invention relates to a high density ceramic thick film fabrication method by screen printing and particularly, to a high-density ceramic thick film fabrication method by screen printing having advantages that patterning is not needed to fabricate a ceramic thick film and thick films of a preferred pattern size can be formed directly.

BACKGROUND ART

In case of fabricating a ceramic thick film by screen printing, there is a main problem that it is difficult to densify a film. Conventionally, a ceramic thick film by screen printing has been densified by adding glassy phase which can be easily fused in a heat processing and filled among particles in a paste for screen printing process. Another method for densification of the film is to perform a pressurized heat process.

Pb $(Zr,Ti)O_3$(PZT) has been studied for applying to micro devices since the ceramic material has piezoelectric and pyroelectric properties. Koch et al. studied a thick film fabrication method by adding 5% of lead borosilicate glass to a paste [Sensors and Actuators A, 70 (1998)98–103]. Chen et al. conducted researches for achieving two objects of densifying and low temperature firing [J. of Appl. Phys, 77(1995)3349–33531] forming a glassy phase by adding 4% of $Li_2 CO_3$ and $Bi_2 O_3$. In addition, Yao et al. conducted a research for densifying a PZT thick film on an alumina substrate by isostatic pressing after screen printing [Sensros and Actuators A, 71 (1998) 139–143]. However, in this method heat processing temperature was so high as 1130° C. that the method could not be applied for micro device element formed on Si.

As another trial for densifing a film, Barrow et al. used a ceramic powders mixed with a sol made of same material. Since empty spaces among ceramic particles were filled with the sol, a denser thick film can be fabricated. They formed a thick film using PZT powders mixed with PZT sol to deposit a 20 $\mu$m of film at low temperature as 650° C. [Appl. Phys. 8(1997) 876–881]. However, the above method has disadvantages that after depositing a film, a post-processing of patterning a film using a mask and etching the film should be required and that forming a uniform film is limited due to separation of ceramic sol and ceramic particles while the film is coated.

DETAILED DESCRIPTION OF THE INVENTION

Therefore, an object of the present invention is to provide a method for fabricating a ceramic thick film at low temperature with the conventional printing method solving the problem of complexity of the conventional art which needs additional patterning processing.

The present invention provides a high density ceramic thick film fabrication method by screen printing which is comprised of the steps of providing vehicle comprising an organic binder and solvent, dispersing ceramic powders into the vehicle to be paste, forming the paste to thick film by screen printing, removing the organic binder from the film, applying sol or sol-like solution to the surface of the film so that the sol or sol-like solution can infiltrate into the film, removing remaining sol or sol-like solution from the surface of the film, drying and preheating the film and sintering the film.

MODE FOR CARRYING OUT THE PREFERRED EMBODIMENTS

Figure 1:
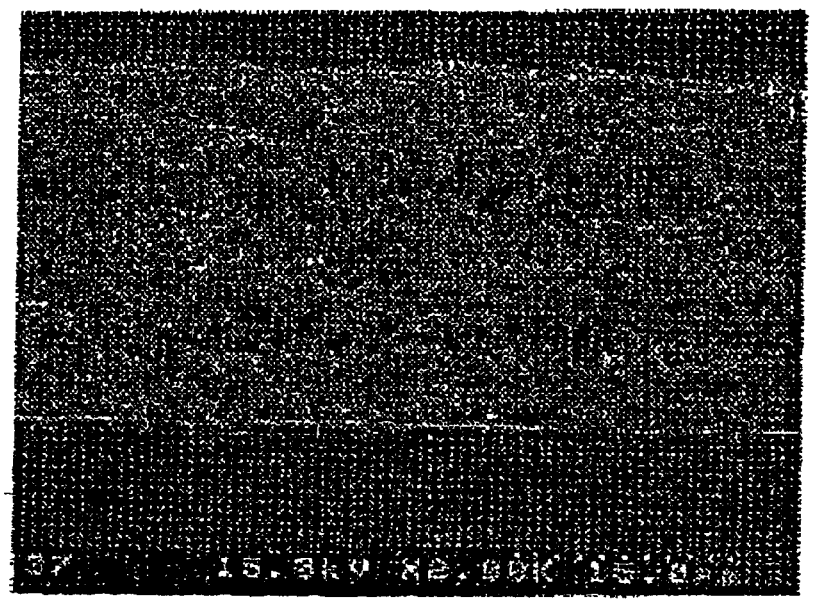
FIG. 1 is a SEM photograph showing an end surface of a ceramic thick film fabricated by the method of the present invention.

In the present invention, the sol-like solution has metal organic (such as alkoxide, hydrate or carbonate) containing PZT component separated, mixed or dissolved in a solvent. A sol or sol-like solution can have identical or different components with ceramic powders used.

In the present invention, sintering temperature ranges from 700° C. to 1200° C., preferably from 800° C. to 900° C. in case of sintering. The thickness of the thick film ranges between 1 and 200 $\mu$m.

Repeatedly forming a thick film with a certain thickness and infiltrating the sol or sol-like solution can densify the thick film more.

The sol or sol-like solution which is applied on the surface of the thick film can be applied before or/and after sintering the thick film. In case of applying the sol or sol-like solution after sintering the thick film, final sintering is performed at the range of 600° C. to 700° C.

Paste made of coating material should be prepared for screen printing in fabricating a ceramic thick film. In case of PZT paste, the film was fabricated through the process of mixing and dispersing PZT powder into a vehicle which comprises an organic binder and a solvent.

In the present invention, PZT sol was newly added besides general components in fabricating such paste.

The sol could be fabricated by a general process. Another components could be added to a sol in order to achieve a certain object. For example, 5 to 20% of PbO could be further added since the material was heat processed at high temperature. Changing the ratio of Zr/Ti could fabricate different kinds of sol. The PZT is a solid solution of $PbTiO_3$ and $PbZrO_3$. Its property is changed according to the Zr/Ti ratio. The piezoelectric or dielectric property was maximized when the ratio of Zr/Ti was 52 mol %/48 mol % but according to the usage, property could be changed varying the ratio of Zr/Ti.

Hereinafter, features and details of the present invention will be described with reference to embodiments.

EXAMPLE 1

The fabricating process began with fabricating a vehicle. The vehicle was prepared using $\alpha$-terpineol, generally used as a solvent of paste, and BEEA (butoxy ethoxy ethyl acetate), PVB (polyvinyl butyral) and PEG (polyethylene glycol) weres added to the solvent to be dissolved completely. Next, PZT powder and PZT sol were mixed and dispersed to the vehicle to form a paste.

The PZT powder was fabricated by the conventional powder manufacturing process. Namely, powders of raw materials were mixed by ball milling for 24 hours by hydro mixing method, dried and calcinated thus to increase reactivity. The powders were ground by attrition milling to be prepared smaller than 0.3 μm in particle size. In fabricating paste, methods of ball milling and three roll milling were used to mix and disperse materials. In the fabricated paste, the ratio of PZT powder was 50 to 85 wt %, that of vehicle is 10 to 25 wt % and that of PZT sol is 5 to 25 wt %.

A thick film was fabricated by printing the thick film using the fabricated paste by screen printing, drying, and sintering at 700 to 1200° C.

Conventional art is not appropriate for screen printing since in the conventional art the paste was fabricated by mixing only PZT powder and PZT sol and viscosity of the paste was low. Accordingly, the conventional art could be applied to dip coating or spin coating. However in case of Example 1 according to the present invention, PZT powder, PZT sol and vehicle were mixed together so as to apply the viscosity of the paste to the screen printing method and to improve dispersibility of the PZT powder in the paste.

EXAMPLE 2

A vehicle was prepared through dissolving BEEA, PVB and PEG completely in a-terpineol in a same manner as Example 1. The PZT powder was mixed and dispersed thus to fabricate PZT paste which did not contain sol and a thick film with a preferred thickness was printed by screen printing. After drying the resultant material, the organic binder was burned out at 400 to 700° C. Then the PZT sol was infiltrated into the thick film by applying PZT sol solution on the surface of the printed film. Later, remained PZT sol was removed by spinning the substrate coated with the thick film and after drying and preheating the film at 80 and 600° C., the film was sintered at 700 to 1200° C. thus to fabricate a thick film.

EXAMPLE 3

A thick film was printed to have a preferred thickness using the paste having the sol fabricated in Example 1. Then the film was dried and the organic solvent was burned out at 400 to 700° C. as in Example 2. The PZT sol solution was infiltrated into the thick film by applying the PZT sol on the surface of the printed thick film. Then the extra PZT sol solution was removed by spinning the sample and after drying and preheating the resultant material at 80 and 600° C., the material was sintered at 700 to 1200° C. thus to form a thick film.

EXAMPLE 4

A thick film was deposited with a same method as in Examples 2 and 3, but in repeated screen printing to have a preferred thickness. The process of applying and infiltrating the sol into the surface of the film as in Examples 2 and 3 was repeated after every screen printing so as to densify the film.

EXAMPLE 5

In the preparing process for fabricating PZT thick film In Examples 1 and 2, 5 to 20% of PbO was added to fabricate a paste.

The reasons that PbO was added are, firstly, that it is necessary to compensate the PbO loss in PZT since PbO components is vaporized in case of heat processing of PZT. Secondly, it is because liquid phase sintering is promoted by adding PbO and accordingly the sintering temperature can be lowered.

Figure 2:
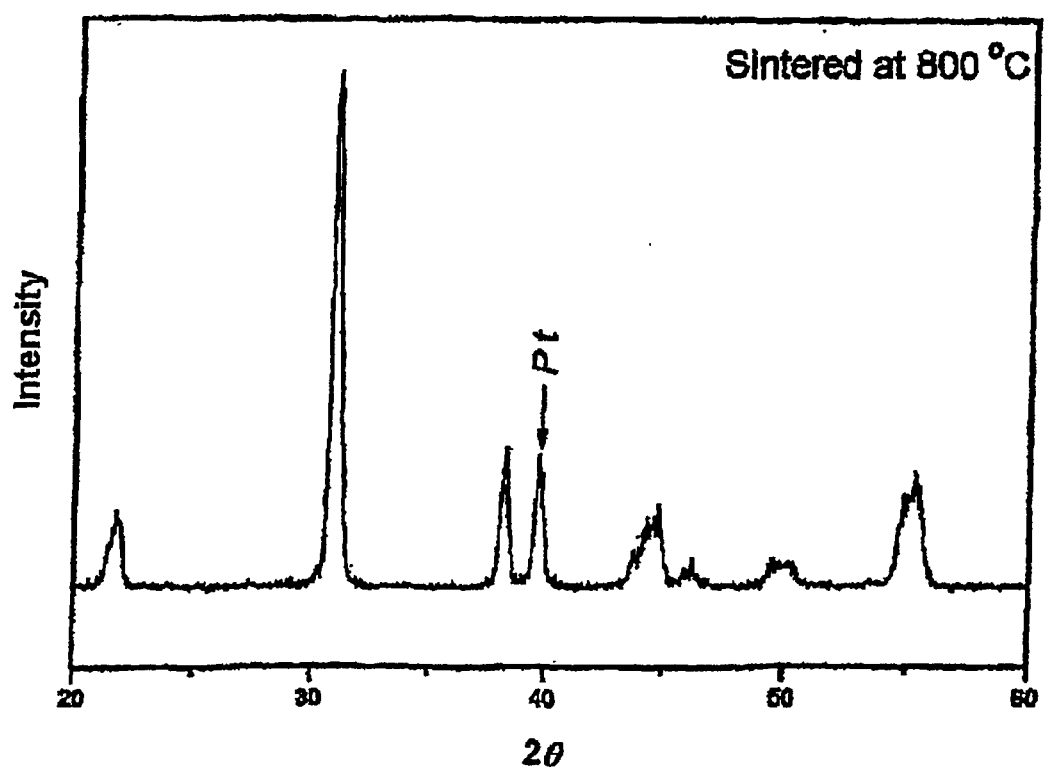
FIG. 2 is a XRD graph illustrating the ceramic thick film using the method of the present invention.

FIG. 1A is a cross sectional view of one of the PZT thick films according to the above Examples. The thickness of the film was 25 μm. FIG. 2 is a XRD graph illustrating the ceramic thick film using the method of the present invention and it shows that a film having an excellent crystal phase was deposited in spite of low heat processing temperature of 800° C.

Table 1 shows piezoelectric property $d_{33}$ of the film which was fabricated by the conventional screen printing and the film which was deposited by sol processing according to the present invention. The table also shows that the piezoelectric constant increases almost two to three times by infiltrating the sol.

TABLE 1

| Changes of piezoelectric constant value before and after densifying by sol infiltration | | |
| --- | --- | --- |
| Section | Before sol infiltrating (pC/N) | After sol infiltrating (pC/N) |
| Piezoelectric constant ($d_{33}$) | 40~70 | 75~190 |

Figure 3A:
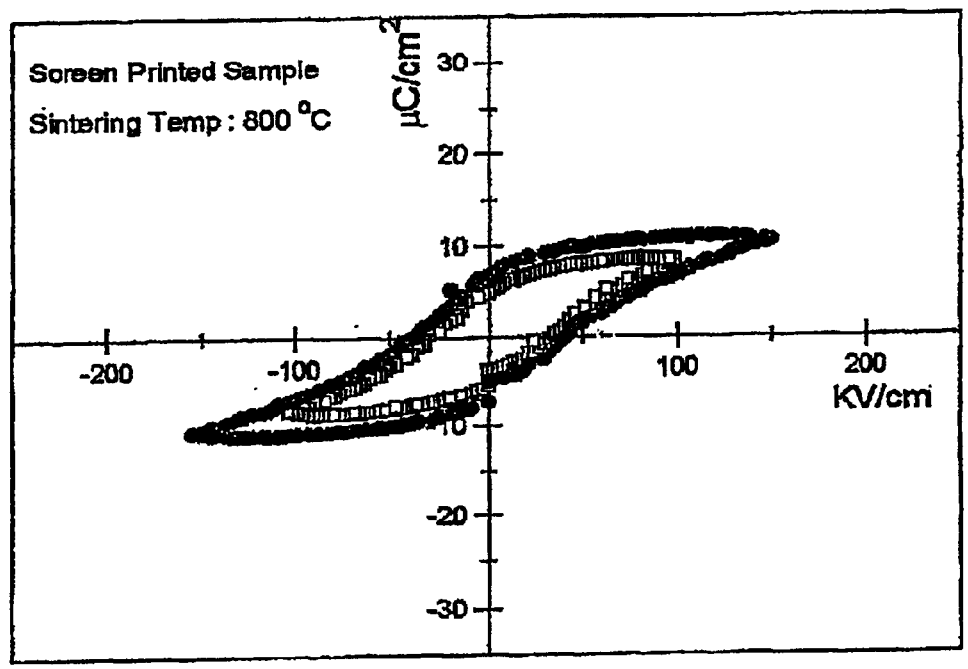
FIGS. 3A and 3B are graphs illustrating P-E electric properties of the ceramic thick film fabricated by the method of the present invention.
Figure 3B:
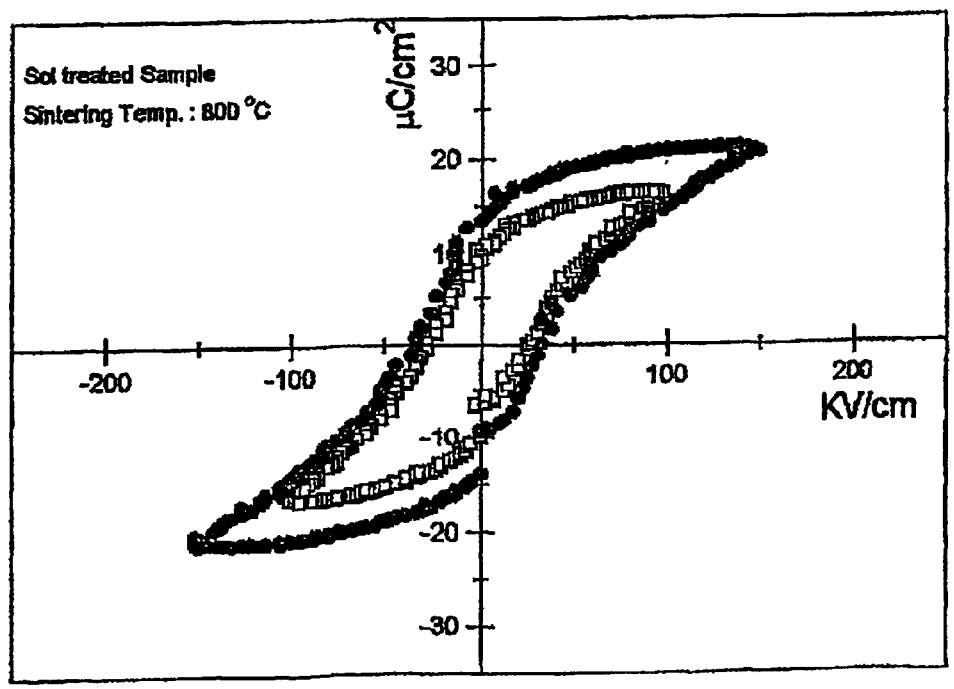

FIGS. 3A and 3B are graphs illustrating a relationship between polarization (P) and electric field (E) of thick films fabricated according to the present invention and showing that the thick films has a high residual polarization of 15 $\mu C/cm^2$.

INDUSTRIAL APPLICABILITY

As so far described, according to the method of the present invention, a high density ceramic thick film by the conventional screen printing, which has advantages that patterning is not needed to fabricate a ceramic thick film and thick films of a preferred pattern size can be formed directly can be fabricated. Therefore, by achieving two objects of densifying and low temperature firing, the present invention can be applied to fabricate micro devices such as a piezoelectric element or a pyroelectric element usefully.

What is claimed is:

1. A method for fabricating a high density ceramic thick film at a thickness of 1–200 μm, comprising the steps of:
   preparing a paste by mixing a PZT-based ceramic powder and a PZT-based sol with a vehicle comprising an organic binder and a solvent;
   forming the paste to thick film by screen printing;
   removing the organic binder from the thick film at 600–700° C.

2. A method for fabricating a high density ceramic thick film at a thickness of 1–200 μm, comprising the steps of:
   preparing a paste by mixing a PZT-based ceramic powder with a vehicle comprising an organic binder and a solvent;
   forming the paste to thick film by screen printing;
   removing the organic binder from the film at 400–700° C.;
   applying a PZT-based sol or a solution of an alkoxide, hydrate or carbonate of PZT components, or mixtures thereof, to the surface of the thick film, so as to infiltrate the tick film;
   removing remaining PZT-based sol, or the solution of an alkoxide, hydrate or carbonate of PZT components, or mixtures thereof from the surface of the thick film by spinning;

drying and preheating the film; and sintering the film at the range from 700 to 1200 C.

3. The method of claim 2, wherein components of the PZT-based ceramic powder in step (1) are the same as components of the PZT-sol, or the solution of an alkoxide, hydrate or carbonate of PZT components, or mixtures thereof in step (4).

4. The method of claim 2, wherein components of PZT-based ceramic powder in step (1) different from components of the PZT-sol, or the solution of an alkoxide, hydrate or carbonate of PZT components, or mixtures thereof in step (4).

5. The method of claim 2, wherein steps (3) to (5) are performed repeatedly at least twice between steps (5) and (6) to densify the thick film.

6. The method of claim 2, wherein the sintering is performed at a temperature of 800–900 C.

7. The method for fabricating a high density ceramic thick film at a thickness of 1–200 μm, comprising the steps of:

preparing a paste by mixing a PZT-based ceramic powder with a vehicle comprising an organic binder and a solvent;

forming the paste to thick film by screen printing;

removing the organic binder from the thick film at 400–14 700° C.;

applying a PZT-based sol, or a solution of an alkoxide, hydrate or carbonate of PZT components, or mixtures thereof, to the surface of the thick film so as to be infiltrated into the thick film;

removing the remaining PZT-based sol, or the solution of an alkoxide, hydrate or carbonate of PZT components, or mixtures thereof surface of the thick film by spinning;

drying and preheating the film at 80–600° C.;

sintering the thick film at 700–900° C.;

applying a PZT-based sol, or a solution of an alkoxide, hydrate or carbonate of PZT components, or mixtures thereof, to the surface of the thick film so as to infiltrate the thick film; and sintering the thick film at 600–700° C.

* * * * *